(12) United States Patent
Otto et al.

(10) Patent No.: US 11,437,540 B2
(45) Date of Patent: *Sep. 6, 2022

(54) COMPONENT HAVING METAL CARRIER LAYER AND LAYER THAT COMPENSATES FOR INTERNAL MECHANICAL STRAINS

(71) Applicant: OSRAM OLED GmbH, Regensburg (DE)

(72) Inventors: Isabel Otto, Regensburg (DE); Korbinian Perzlmaier, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/148,208

(22) Filed: Jan. 13, 2021

(65) Prior Publication Data

US 2021/0135046 A1 May 6, 2021

Related U.S. Application Data

(62) Division of application No. 16/322,995, filed as application No. PCT/EP2017/068470 on Jul. 21, 2017, now Pat. No. 10,910,513.

(30) Foreign Application Priority Data

Aug. 5, 2016 (DE) ..................... 10 2016 114 550.5

(51) Int. Cl.
  *H01L 33/00* (2010.01)
  *H01L 27/15* (2006.01)
  (Continued)

(52) U.S. Cl.
  CPC ........ *H01L 33/0093* (2020.05); *H01L 27/153* (2013.01); *H01L 33/405* (2013.01); *H01L 33/62* (2013.01); *H01L 33/647* (2013.01)

(58) Field of Classification Search
  CPC ...... H01L 33/405; H01L 33/62; H01L 27/153
  (Continued)

(56) References Cited

U.S. PATENT DOCUMENTS 7,020,349 B2    3/2006  Brunk
9,054,016 B2    6/2015  Moosburger et al.
(Continued)

FOREIGN PATENT DOCUMENTS

CN    102227807 A    10/2011
CN    103325749 A    9/2013
(Continued)

OTHER PUBLICATIONS

The Third Office Action dated Aug. 30, 2021, of counterpart Chinese Application No. 201780049337.3, along with English translation.

(Continued)

*Primary Examiner* — Quoc D Hoang
(74) *Attorney, Agent, or Firm* — DLA Piper LLP (US)

(57) ABSTRACT

A component includes a carrier and a semiconductor body arranged on the carrier, wherein the semiconductor body includes a semiconductor layer facing away from the carrier, a further semiconductor layer facing the carrier and an optically active layer located therebetween, the carrier has a metallic carrier layer that is contiguous and mechanically stabilizes the component, the carrier includes a mirror layer disposed between the semiconductor body and the metallic carrier layer, the carrier has a compensating layer directly adjacent to the metallic carrier layer and is configured to compensate for internal mechanical strains in the component, and the compensating layer is arranged between the semiconductor body and the metallic carrier layer.

20 Claims, 5 Drawing Sheets

(51) Int. Cl.
*H01L 33/62* (2010.01)
*H01L 33/40* (2010.01)
*H01L 33/64* (2010.01)

(58) Field of Classification Search
USPC .......................................................... 257/98
See application file for complete search history.

(56) References Cited

U.S. PATENT DOCUMENTS

| | | | |
|---|---|---|---|
| 10,910,513 B2* | 2/2021 | Otto | .................... H01L 33/0093 |
| 2009/0278233 A1 | 11/2009 | Pinnington et al. | |
| 2013/0249011 A1 | 9/2013 | Choi et al. | |
| 2015/0325742 A1 | 11/2015 | Liu et al. | |

FOREIGN PATENT DOCUMENTS

| | | |
|---|---|---|
| CN | 105514231 A | 4/2016 |
| DE | 10 2009 006 177 A1 | 6/2010 |
| DE | 10 2009 032 486 A1 | 1/2011 |
| DE | 10 2012 217 533 A1 | 3/2014 |
| DE | 10 2014 107 123 A1 | 11/2015 |
| EP | 2 600 389 A1 | 6/2013 |
| JP | 2006-229153 A | 8/2006 |
| JP | 4731180 B2 | 7/2011 |
| WO | 2013/011415 A1 | 1/2013 |
| WO | 2016/202978 A1 | 12/2016 |
| WO | 2017/036918 A1 | 3/2017 |

OTHER PUBLICATIONS

The Second Office Action from corresponding Chinese Appln. No. 201780049337.3 dated Mar. 26, 2021, along with an English translation.

Hofmann, W., "InP-based Long-Wavelength VCSELs and VCSEL Arrays for High-Speed Optical Communication," *Selected Topics of Semiconductor Physics and Technology*, 2009, vol. 99, Doktorarbeit, Technische Universität München, ISBN 978-3-932749-99-5, 152 pages.

The First Office Action dated Oct. 13, 2020, of counterpart Chinese Application No. 201780049337.3, along with an English translation.

* cited by examiner

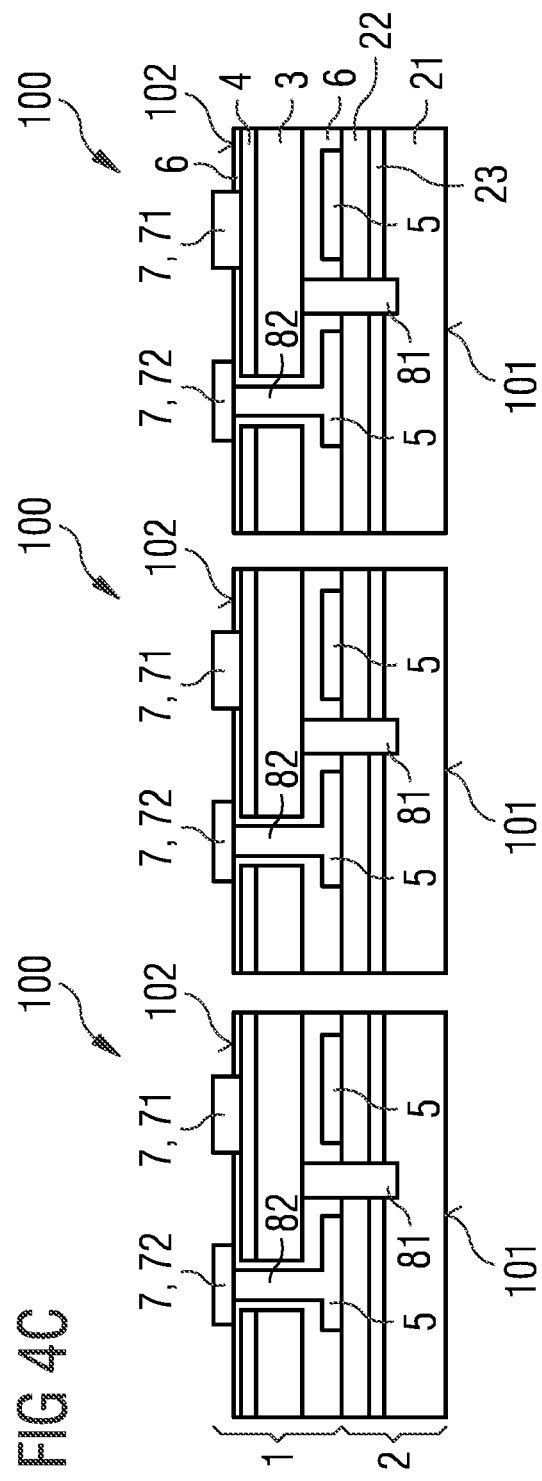

COMPONENT HAVING METAL CARRIER LAYER AND LAYER THAT COMPENSATES FOR INTERNAL MECHANICAL STRAINS

TECHNICAL FIELD

This disclosure relates to a component, in particular an optoelectronic semiconductor chip with reduced overall height, and a method of manufacturing a plurality of components.

BACKGROUND

In a component having a molded body acting as a carrier, a casting compound is usually applied to a rear side of the component, wherein rear side contacts are first covered and then opened again by regrinding the molded body. In addition, solderable terminal points on the rear side of the component can only be defined by additional processes. In a component without a molded body, whose carrier is particularly metallic, unwanted deformations often occur during manufacture of the component due to internal (thermo-)mechanical strains. Such unwanted deformations can cause a semiconductor wafer to roll up, make the semiconductor wafer difficult to be processed and result in a reduction in the overall yield.

It could therefore be helpful to provide a component having a low overall height and high mechanical stability at the same time as well as a simplified and efficient method of manufacturing a plurality of components.

SUMMARY

We provide a component including a carrier; and a semiconductor body arranged on the carrier, wherein the semiconductor body includes a semiconductor layer facing away from the carrier, a further semiconductor layer facing the carrier and an optically active layer located therebetween, the carrier has a metallic carrier layer that is contiguous and mechanically stabilizes the component, the carrier includes a mirror layer disposed between the semiconductor body and the carrier layer, and the carrier has a compensating layer directly adjacent to the carrier layer and configured to compensate for internal mechanical strains in the component.

We also provide a method of manufacturing a plurality of components including a) providing a semiconductor wafer having a semiconductor body composite on a substrate; b) forming a common stabilization layer on the semiconductor body composite; c) determining mechanical strains in the semiconductor wafer; d) forming a common compensation layer such that the common compensation layer and the common stabilization layer are directly adjacent to each other, wherein the common compensation layer is configured to compensate for internal mechanical strains in the semiconductor wafer; e) detaching the substrate from the semiconductor wafer; and f) singulating the semiconductor wafer into a plurality of components such that the components each have a semiconductor body arising from the semiconductor body composite and a carrier, wherein the carrier includes a metallic carrier layer arising from the common stabilization layer and a compensating layer arising from the common compensation layer, and the compensating layer directly adjoins the carrier layer and is formed to compensate for internal mechanical strains in the component.

We further provide a component including a carrier and a semiconductor body arranged on the carrier, wherein the semiconductor body includes a semiconductor layer facing away from the carrier, a further semiconductor layer facing the carrier and an optically active layer located therebetween, the carrier has a metallic carrier layer that is contiguous and mechanically stabilizes the component, the carrier includes a mirror layer disposed between the semiconductor body and the metallic carrier layer, the carrier has a compensating layer directly adjacent to the metallic carrier layer and is configured to compensate for internal mechanical strains in the component, and the compensating layer is arranged between the semiconductor body and the metallic carrier layer.

BRIEF DESCRIPTION OF THE DRAWINGS

FIGS. 4A, 4B and 4C show schematic representations of different method steps for the production of a plurality of components.

LIST OF REFERENCE SIGNS

Figure 1:
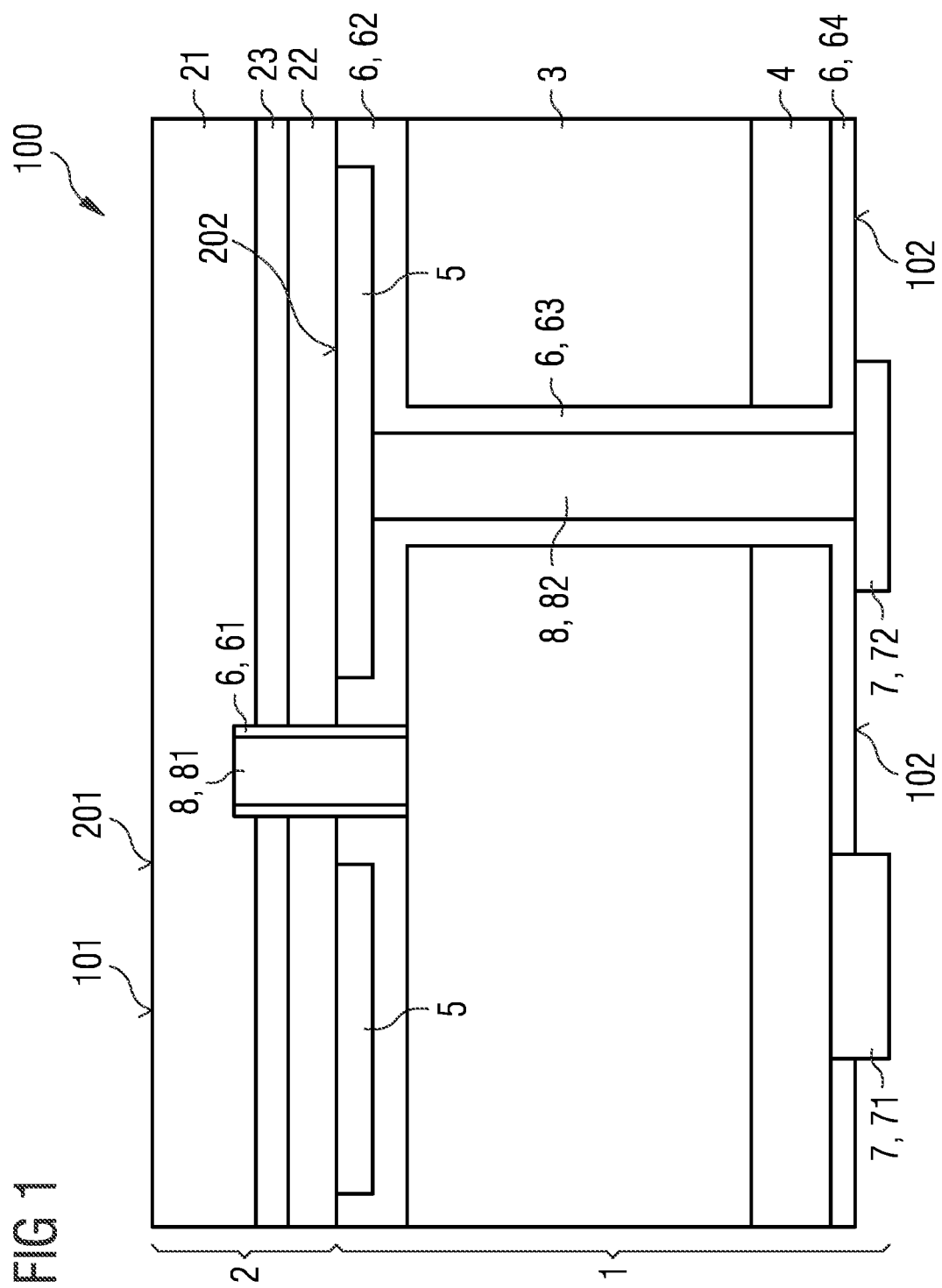
FIG. 1 shows a schematic representation of a component according to a first example in sectional view.

100 Component
101 Front side of the component
102 Rear side of the component
1 Carrier
10 Semiconductor wafer
2 Semiconductor body
20 Semiconductor body composite
201 First main surface of the semiconductor body
202 Second main surface of the semiconductor body
21, 22 Semiconductor layer
23 Optically active layer
3 Carrier layer
30 Common stabilization layer
4 Compensating layer
40 Common compensation layer
5 Mirror layer
6 Insulation structure
61, 62 Insulation layer
63, 64 Further insulation layer
7 Connection layer
71, 72 Terminal point
8 Contact structure
81, 82 Through-contact
90 Substrate/Growth substrate
AB Separation line

DETAILED DESCRIPTION

Our component may have a carrier and a semiconductor body arranged on the carrier. The semiconductor body has a semiconductor layer facing away from the carrier, a further semiconductor layer facing towards the carrier and an optically active layer located therebetween. During operation of the component, the optically active layer is configured in particular to emit electromagnetic radiation in the ultraviolet, visible or infrared spectral range. Alternatively, it is also possible for the optically active layer to be configured to absorb electromagnetic radiation and convert it into electrical signals. The carrier has a metallic carrier layer formed contiguously and mechanically stabilizes the component. In particular, the carrier layer forms a main integral part of the carrier that mechanically supports the component. The carrier layer has a compensating layer that preferably adjoins the carrier layer directly and is configured to compensate for internal mechanical strains in the carrier layer or component.

With regard to their material selection and/or layer thicknesses and/or design, the compensating layer and the carrier layer are preferably formed such that they exhibit opposite strains so that the carrier or in particular the component as a whole is essentially strain-free. The semiconductor body can be arranged directly or up to a contact level directly on the carrier. The component is preferably free of a further carrier substrate arranged between the semiconductor body and the carrier having the metallic carrier layer or is arranged on that side of the semiconductor body facing away from the carrier or on that side of the carrier facing away from the semiconductor body. The carrier having the metallic carrier layer is preferably the only carrier of the component. Such a component can have a particularly low overall height and yet a particularly high mechanical stability. In a process of manufacturing a plurality of such components from a semiconductor wafer, the compensating layer may prevent the semiconductor wafer from being rolled up since the compensating layer and the carrier layer are formed as far as possible such that they have opposite strains so that the semiconductor wafer as a whole is substantially free of distortion and free of mechanical bending.

The carrier may comprise a mirror layer disposed between the semiconductor body and the carrier layer. The mirror layer can be directly adjacent to the carrier layer or the compensating layer. The mirror layer can be electrically conductive and electrically connected to the carrier layer or to the compensating layer. Alternatively, it is possible for the mirror layer to be electrically isolated from the carrier layer and the compensating layer. For example, the mirror layer can serve as a current expansion layer and electrically connects to that semiconductor layer of the semiconductor body facing the carrier. Alternatively, it is possible for the mirror layer to electrically conductively connect to the semiconductor layer of the semiconductor body facing away from the carrier, for example, via a through-contact or a plurality of through-contacts extending throughout the active layer.

The compensating layer may be laterally flush or substantially laterally flush with the metal carrier layer. "Substantially laterally flush" means that the compensating layer and the metallic carrier layer are flush to the lateral side within manufacturing tolerances, or that one of the two layers is laterally receded at least in places compared to the other due to a subsequent manufacturing process, e.g., by etching or by post-processing. It is also possible that, in a plan view, the compensating layer and the carrier layer are substantially congruent, i.e., within manufacturing tolerances.

The compensating layer may be formed as a planar layer. In particular, the compensating layer has an essentially constant layer thickness, i.e., within the manufacturing tolerances, along lateral directions. Preferably, the carrier layer is formed such that it has an essentially constant layer thickness along lateral directions. Within the manufacturing tolerances, the carrier layer and/or the compensating layer can each have a constant layer thickness, even if the layers have chamfers at their edges. The carrier layer and/or compensating layer may be free of local vertical elevations and/or free of vertical branches.

A lateral direction is generally understood to be a direction that runs along, in particular parallel to, a main extension plane of the component or of the semiconductor body. A vertical direction, on the other hand, is a direction directed transversely, in particular perpendicularly, to the main extension plane of the component or of the semiconductor body. The vertical direction is for instance a growth direction of the semiconductor body. The vertical direction and the lateral direction are especially perpendicular to each other.

The metallic carrier layer may be formed as a mechanically self-supporting layer. The carrier layer can thus be formed as an independent layer that is mechanically stable to its own weight even without mechanical support from other layers. In this example, the component can be mechanically supported only or mainly by the carrier layer. It is possible that the compensating layer is formed as a mechanically self-supporting layer. Apart from the compensating layer and/or the metallic carrier layer, the component or the carrier is in particular free from further carrier layers. For example, besides the compensating layer and the carrier layer, the component is free of further individual mechanically stable layers having a layer thickness greater than 10 μm, 20 μm, 50 μm or greater than 80 μm.

The carrier layer may have a vertical layer thickness of 1 μm to 80 μm, for instance 5 μm to 80 μm, in particular 10 μm to 60 μm or 10 μm to 30 μm. The compensating layer may have a vertical thickness of 200 nm to 30 μm, for instance 1 μm to 30 μm, for instance 1 μm to 20 μm, or 3 μm to 10 μm. Preferably, the component has a total vertical height of 9 μm to 100 μm, 30 μm to 100 μm, for instance 9 μm to 50 μm or 30 μm. The carrier layer may have a vertical height of at least 50%, for instance at least 60% or at least 70% of the total height of the component. In particular, at least 60%, 70%, 80% or at least 90% of the volume and/or mass of the carrier or of the component may be accounted for by the carrier layer or the carrier layer and the compensating layer.

In a plan view, the carrier layer may completely cover the semiconductor body with the exception of possible openings extending throughout the carrier layer. Analogous to the carrier layer, in a plan view, the compensating layer can also completely cover the semiconductor body with the exception of possible openings extending throughout the compensating layer.

The metallic carrier layer may comprise at least one material from the group consisting of Ni, Cu, W, Au, Al, Pt and Ti or from other metals. The carrier layer comprises a metal or consists of a metal or of a metal alloy.

The compensating layer may comprise at least one material from the group consisting of TiW, Ti, TiN, SiN, Si, Pt, TiWN, WN, Ni and silicon oxide or similar material. Preferably, the compensating layer comprises a material that can be deposited on another layer by sputtering or a coating process such as chemical vapor deposition (CVD). Especially preferred, the carrier comprises a carrier layer made of nickel and a compensating layer made of TiW or TiWN or TiN.

The carrier may be free of a shaped body made of plastic, silicone, epoxy, ceramic or of a semiconductor material, for instance free of a molded body. In particular, the component is free from a carrier made of a potting compound. In case of doubt, a shaped body of the carrier is understood to be an integral part of the carrier different from the carrier layer and the compensating layer and makes a substantial contribution to increasing the mechanical stability of the carrier or the component.

The component may be formed as an optoelectronic semiconductor chip. The carrier of the component serves as a chip carrier. In particular, the semiconductor chip has the carrier comprising the metallic carrier layer as the only carrier.

The metallic carrier layer may electrically conductively connect to the semiconductor body. For example, the metallic carrier layer may electrically conductively connect to a radiation-reflecting layer, for instance to the mirror layer arranged in particular between the semiconductor body and the metallic carrier layer and is in electrical contact with the semiconductor body. Alternatively, it is possible for the metallic carrier layer to be electrically isolated from the mirror layer. In this example, the metallic carrier layer can electrically connect to the semiconductor body via a through-contact that extends throughout the mirror layer in the vertical direction and is electrically isolated from it.

The component may have a contact structure configured to electrically contact the semiconductor layers of the semiconductor body. The contact structure can be at least partly integrated within the carrier and partly within the semiconductor body. In the semiconductor body, the contact structure may have a first through-contact extending throughout a semiconductor layer of a first conductivity type and the active layer to a further semiconductor layer of another, second conductivity type. The metallic carrier layer can be in electrical contact with the first through-contact of the contact structure or electrically isolated from it. The contact structure may have a second through-contact extending throughout the carrier layer. The second through-contact can be electrically isolated from the metallic carrier layer by an insulation structure.

The first through-contact and/or the second through-contact can each be formed as one piece. The carrier layer and/or the compensating layer may be contiguous and one piece. A one-piece-formed structure is generally understood to be a contiguous and coherent structure. The one-piece structure is in particular free of an inner bonding layer or an inner bonding surface and may be made consistently of the same material. For example, the one-piece structure can be produced in a single process step or in equivalent process steps.

The component may have a front side formed as a radiation passage surface and a rear side facing away from the front side. The rear side of the component can be formed by a surface of the carrier facing away from the semiconductor body. Preferably, the component can be externally electrically contacted exclusively via the rear side. For example, on its rear side, the component has a first terminal point and a second terminal point, wherein the component can connect to an external power source via the terminal points. The component can thus be externally electrically contacted exclusively via the rear side, i.e., via the carrier, and is formed for instance as a surface-mountable component.

In at least one method of manufacturing a plurality of components, a semiconductor wafer having a semiconductor body composite is provided on a substrate, in particular on a growth substrate. A common stabilization layer is formed on the semiconductor body composite. The common stabilization layer can be metallic and in particular mechanically stabilizes the semiconductor wafer, for example, after the substrate has been removed from the semiconductor wafer. The mechanical strains in the semiconductor wafer are determined. This can be identified after the common stabilization layer has been applied to the semiconductor body composite. Alternatively, it is also possible that the determination of mechanical strains is theoretically carried out beforehand in known materials and/or layer thicknesses of the stabilization layer and of the semiconductor body composite.

In a further process step, a common compensation layer is formed on the semiconductor body composite such that the common compensation layer and the common stabilization layer are directly adjacent to each other. The common compensation layer is especially formed to compensate internal mechanical strains in the semiconductor wafer. The compensation layer and the stabilization layer are preferably adapted to each other for instance with regard to their material selection, layer thickness or design such that they exhibit opposite internal mechanical strains.

After the substrate has been detached from the semiconductor wafer, the semiconductor wafer is singulated into a plurality of components such that the components each comprise a semiconductor body of the semiconductor body composite and a carrier. In particular, the carrier has a metallic carrier layer arising from the common stabilization layer and a compensating layer arising from the common compensation layer. The compensating layer is located for instance directly adjacent to the carrier layer and formed to compensate internal mechanical strains in the component. On the side, the compensating layer and the metallic carrier layer can be flush or essentially flush with each other right after singulation. It is possible that the semiconductor wafer may be singulated throughout the common stabilization layer and/or the common compensation layer. In this example, the metallic carrier layer and/or the compensating layer may show lateral singulation traces, e.g., on the side flanks of the component.

In the method, the common stabilization layer may be formed as a contiguous unit. Preferably, the stabilization layer has a sufficiently high vertical layer thickness, for instance 5 µm to 50 µm, or 5 µm to 30 µm, for instance 10 µm to 20 µm, to form a self-supporting structure that, after removing the substrate, supports and mechanically stabilizes the semiconductor wafer. To ensure the workability of the semiconductor wafer, the stabilization layer and the compensation layer are formed such that in total, the semiconductor wafer is as strain-free as possible and forms a disc which is as flat as possible, in particular after the substrate has been detached.

In the method, the stabilization layer and the compensation layer may be formed from different materials. In particular, the compensation layer has a material suitable for modifying and, if necessary, compensating the strain in the stabilization layer. Materials such as TiW, Ti, TiN, SiN, Si, Pt, TiWN, WN, Ni and silicon oxide that can typically be deposited by sputtering or CVD processes are particularly suitable for this purpose. In particular, not only the strains in the stabilization layer but also the strains in the previously deposited layers such as in the semiconductor layers can be compensated or brought to a desired strain level to counteract the strain modification by subsequent processes.

After the compensation layer has been applied to the semiconductor body composite, the mechanical strain in the semiconductor wafer may be measured for control purposes. If necessary, the strain in the semiconductor wafer can be adjusted by repeatedly applying or removing parts of the compensation layer.

The mechanical strain in the semiconductor wafer may be determined after formation of the common stabilization layer. In a subsequent process step, the common compensation layer that compensates for internal mechanical strains is applied directly onto the common stabilization layer. Alternatively, prior to application of the stabilization layer, for example, by simulations, it is also possible to determine the mechanical strains in the semiconductor wafer theoretically using specified materials and specified layer thicknesses of the semiconductor body composite and of the common stabilization layer. The common compensation layer can be applied onto the semiconductor body composite prior to or after formation of the common stabilization layer in known theoretically determined mechanical strains in the semiconductor wafer. If the compensation layer is applied onto the semiconductor body composite before the stabilization layer, it can be formed as a modified seed layer onto which the common stabilization layer is electroplated. The modified seed layer may have a vertical height of at least 1 µm or at least 3 µm.

The component may be manufactured such that it is free of a carrier produced separately from the semiconductor body. This means in particular that prior to singulation of the semiconductor wafer, all integral parts of the carrier of the component in question are formed on the semiconductor body composite. The carrier of the component is thus formed layer by layer on the semiconductor body of the component. Right after singulation, each component has a carrier comprising a metallic carrier layer and a compensating layer.

The method described above is particularly suitable for the manufacture of the component described here. The features described in connection with the component can therefore also be used for the method and vice versa.

Further advantages, preferred examples and further developments of the component and the method will become apparent from the examples explained in the following in connection with FIGS. 1 to 4C.

Identical, equivalent or equivalently acting elements are indicated with the same reference numerals in the figures. The figures are schematic illustrations and thus not necessarily true to scale. Comparatively small elements and particularly layer thicknesses can rather be illustrated exaggeratedly large for the purpose of better clarification.

An example for a component 100 is shown schematically in FIG. 1 in sectional view. The component 100 comprises a carrier 1 and a semiconductor body 2 arranged on the carrier 1. The semiconductor body 2 directly adjoins the carrier 1. In particular, the carrier 1 is different from a growth substrate. The semiconductor body 2 comprises a first semiconductor layer 21 of a first conductivity type facing away from the carrier 1, a second semiconductor layer 22 of a second conductivity type facing towards the carrier 1 and an optically active layer 23 disposed between the first and second semiconductor layers. In particular, the semiconductor body 2 is based on a III-V compound semiconductor material such as gallium nitride. The first semiconductor layer 21 and the second semiconductor layer 22 are n- or p-conducting and can be n- or p-doped. The first semiconductor layer 21 is preferably n-conductive.

The semiconductor body 2 has a first main surface 201 facing away from the carrier 1 that is formed in particular as a radiation passage surface or a radiation exit surface 101 of the component 100. FIG. 1 shows the unstructured radiation passage surface 101. Deviating from this, it is possible that the radiation passage surface 101 is structured and has decoupling structures. The first main surface 201 and the second main surface 202 each delimit the semiconductor body 2 in a vertical direction. In particular, the second main surface 202 forms a common interface between the semiconductor body 2 and the carrier 1.

The carrier 1 has a mirror layer 5, a contact structure 8, an insulation structure 6, a carrier layer 3, a compensating layer 4 and a connection layer 7. The metallic carrier layer 3 is arranged between the semiconductor body 2 and the compensating layer 4. The component 100 can externally electrically connect via the carrier 1. The semiconductor body 2 electrically connects to a first terminal point 71 and a second terminal point 72 on a rear side 102 of the component 100 via the connection layer 7.

In particular, the first semiconductor layer 21 electrically connects to the first terminal point 71 via a first through-contact 81 of the contact structure 8, the carrier layer 3 and via the compensating layer 4. In the vertical direction, the first through-contact 81 extends throughout the mirror layer 5, the second semiconductor layer 22 and the active layer 23 into the first semiconductor layer 21. The second semiconductor layer 22 electrically conductively connects to the second terminal point 72, in particular via the mirror layer 5 and the second through-contact 82 that extends in the vertical direction throughout the compensating layer 4 and the metallic carrier layer 3. The mirror layer 5, the carrier layer 3 and the compensating layer 4 can each be formed as one contiguous layer. In particular, the compensating layer 4 and/or the metallic carrier layer 3 can each be formed in one piece.

The insulation structure 6 comprises a plurality of subregions 61, 62, 63 and 64 that in particular adjoin each other and can be produced in different process steps. The contact structure 8 as shown in FIG. 1 is regionally integrated within the semiconductor body 2 and regionally integrated within the carrier 1. In the region of the semiconductor body 2 and in lateral directions, the first through-contact 81 of the contact structure 8 is electrically isolated from the second semiconductor layer 22 and the optically active layer 23 by a first subregion 61 of the insulation structure 6. In the region of the carrier 1 and in lateral directions, the second through-contact 82 of the contact structure 8 is electrically insulated from the metallic carrier layer 3 and the compensating layer 4 by a third subregion 63 of the insulation structure 6. The first through-contact 81 and the second through-contact 82 are assigned to different electrical polarities of the component. In the vertical direction, a second subregion 62 of the insulation structure 6 is arranged between the metallic carrier layer 3 and the mirror layer 5 so that the mirror layer 5 and the carrier layer 3 are electrically insulated from each other by the second subregion 62. A fourth subregion 64 of the insulation structure 6 is located on the rear side 102 of the component 100 and insulates the second terminal 72 from the compensating layer 4 or from the metallic carrier layer 3.

In FIG. 1, the metallic carrier layer 3 forms a main integral part of the carrier 1. In particular, the metallic carrier layer 3 may account for at least 50%, at least 70%, 80% or 90% of the volume and/or mass of the carrier 1. The component 100 is therefore mainly supported by the metallic carrier layer 3. Compared to all other layers of the carrier 1 or the component 100, the carrier layer 3 has the largest vertical height, in particular with the exception of the second through-contact 82. In particular, the carrier layer 3 has a vertical height at least 2 times, 3 times, 5 times or 10 times as great as a vertical height of the compensating layer 4 or of the mirror layer 5 or of the connection layer 7.

In particular, the compensating layer 4 and the metallic carrier layer 3 have different materials. These layers are preferably formed such that they exhibit opposite strains so that in total, the component 100 is essentially free of strain and mechanical bending. In particular, in a plan view, the metallic carrier layer 3 and the compensating layer 4 are congruent. The compensating layer 4 can be flush with the metallic carrier layer 3 on the side. On one side flank or all side flanks of the component 100, the metallic carrier layer 3 and the compensating layer 4 may show singulation traces. The side flanks of the component 100 can thus comprise surfaces of the metallic carrier layer 3 and the compensating layer 4.

In FIG. 1, the mirror layer 5 is formed such that in lateral directions it is enclosed by the insulation structure 6, in particular by the second subregion 62 of the insulation structure 6. The mirror layer 5 can contain materials such as aluminum or silver that are usually susceptible to corrosion. The lateral wrapping of the mirror layer 5 by the insulation structure 6 protects the mirror layer 5 from external environmental influences.

In FIG. 1, in a plan view of the rear side 102 of the component 100, the metallic carrier layer 3 completely covers the semiconductor body 2 except for one or several openings through which several through-contacts or the second through-contact 82 extend/s. The metallic carrier layer 3 is formed contiguously, wherein the semiconductor body 2 is arranged essentially on a metallic carrier so that the component 100, as a whole, is particularly mechanically stable. Since the component 100 does not have any carrier layers other than the compensating layer 4 and the metallic carrier layer 3 or any other layers formed as carriers, the component 100 can be formed particularly thin and at the same time in a compact and stable manner.

Figure 2:
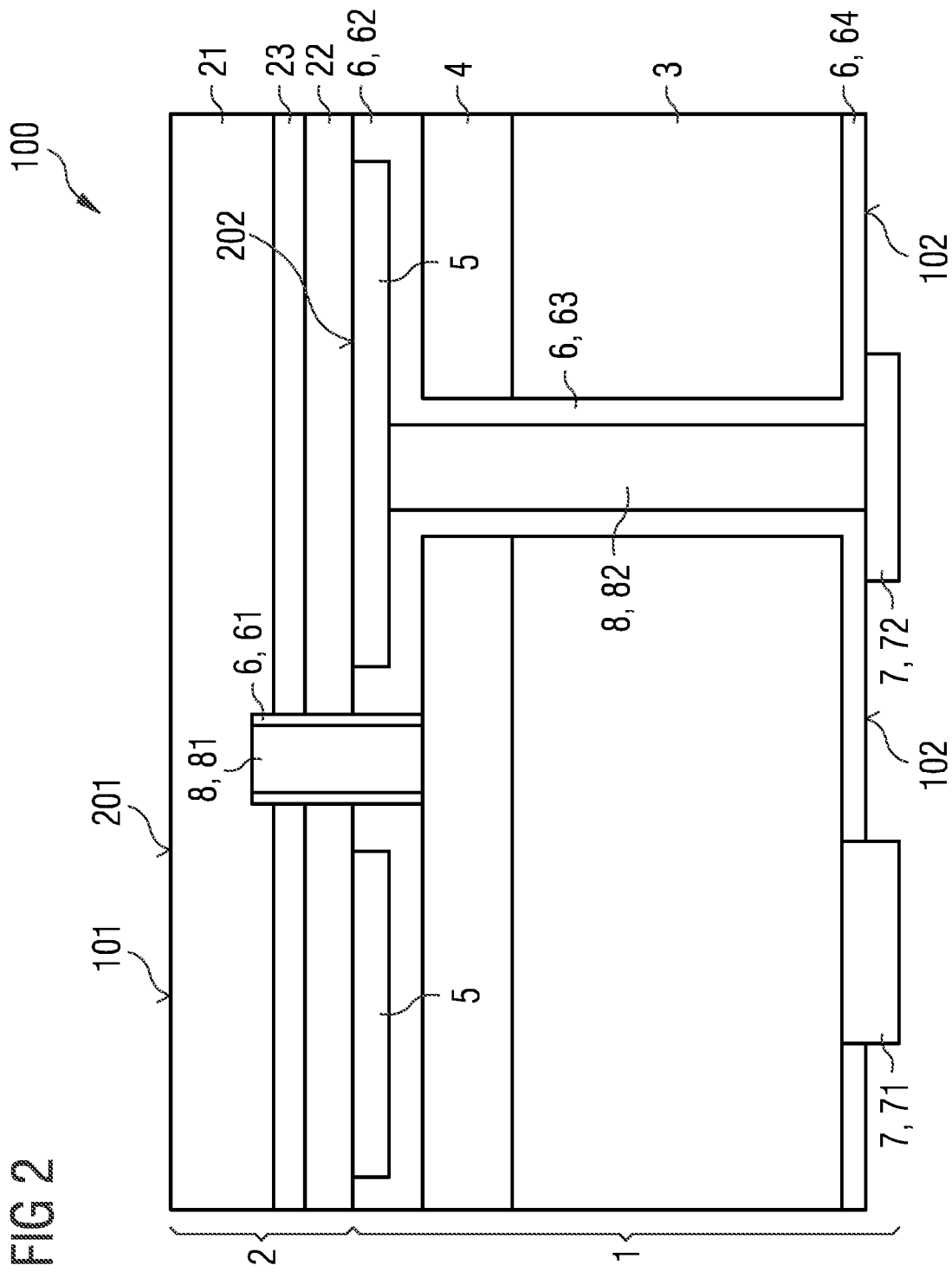
FIGS. 2 and 3 show further examples of a component in schematic sectional views.

FIG. 2 shows another example of a component 100. The example shown in FIG. 2 essentially corresponds to the example for a component shown in FIG. 1. In contrast to this, the compensating layer 4 is arranged between the semiconductor body 2 and the metallic carrier layer 3. In this example, the compensating layer 4 can be formed as a modified seed layer on which the metallic carrier layer 3 is formed, for example, by a coating process, in particular by an electroplating process.

Figure 3:
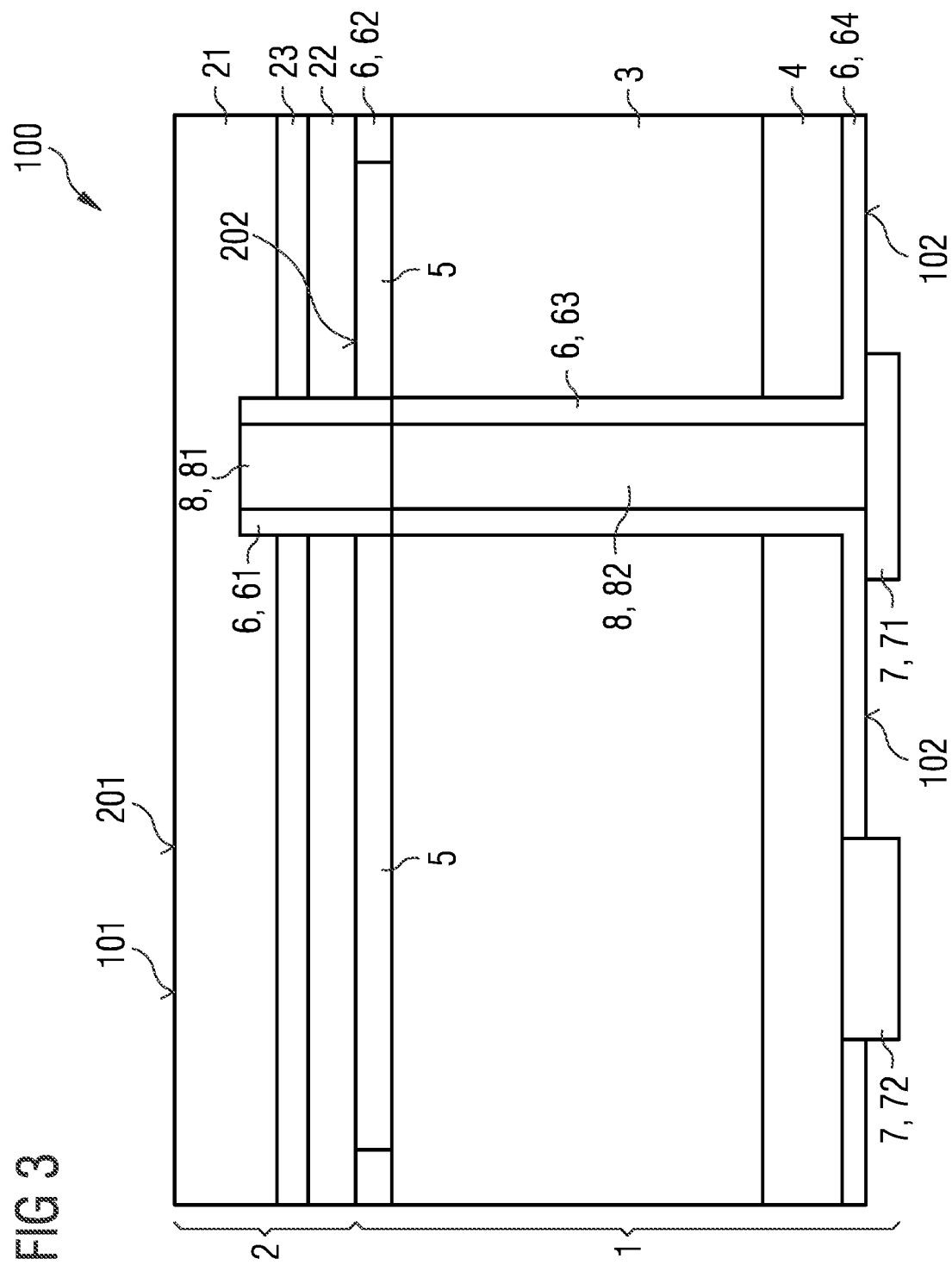

FIG. 3 shows another example of a component. This example essentially corresponds to the example of a component shown in FIG. 1. In contrast, the metallic carrier layer 3 electrically connects to the second semiconductor layer 22 via the mirror layer 5. The first through-contact 81 and the second through-contact 82 of the contact structure 8 are assigned to the same electrical polarity of the component 100 and are in electrical contact with each other. In a plan view, the first through-contact 81 and the second through-contact 82 have overlaps. In particular, the first through-contact 81 directly adjoins the second through-contact 82.

In FIGS. 1 to 3, the compensating layer 4 is preferably electrically conductive. In deviation from this, it is possible that the compensating layer 4 is formed from a material that is electrically insulating or weakly electrically conductive. In this example, the compensating layer 4 may have one or several openings filled with an electrically conductive material, for example, with a metal so that electrical connections are formed between the carrier layer 3 and the mirror layer 5 or between the carrier layer 3 and the connection layer 7. Deviating from FIGS. 1 to 3, it is possible that the mirror layer 5 is electrically isolated from the second semiconductor layer 22. In this example, the mirror layer 5 may electrically connect to the first semiconductor layer 21 via the first through-contact 81 or via a plurality of first through-contacts 81.

Figure 4A:
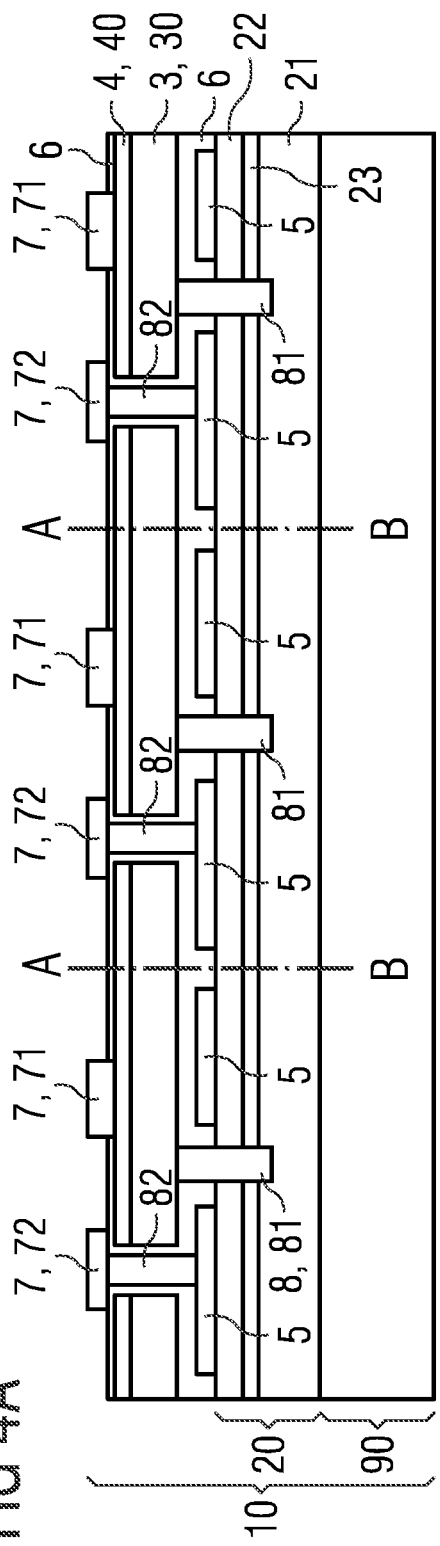
Figure 4B:
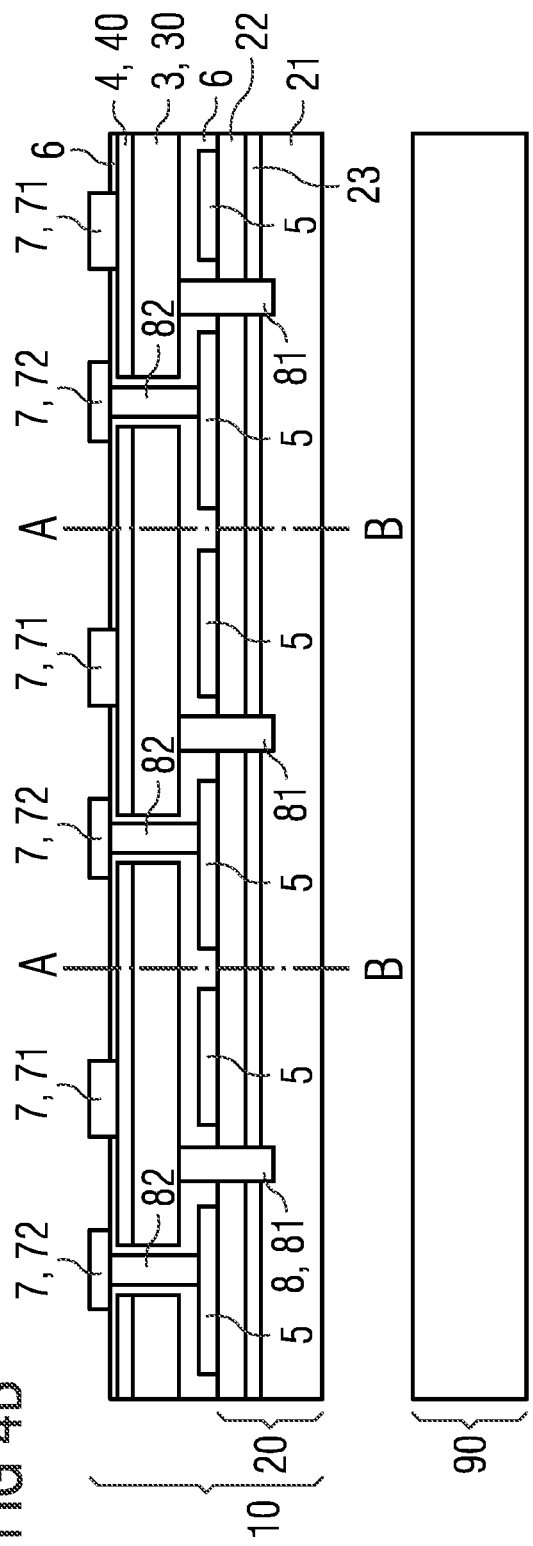

FIGS. 4A, 4B and 4C show schematic illustrations of various method steps for the manufacture of a plurality of components.

FIG. 4A shows a semiconductor wafer 10 having a substrate 90 and a semiconductor body composite 20 arranged on the substrate 90. In particular, the substrate 90 is a growth substrate such as a sapphire substrate. A structured mirror layer 5 is formed on the semiconductor body composite 20. The structured mirror layer 5 may have a plurality of openings and a plurality of separation trenches, wherein first through-contacts 81 of the contact structure 8 are formed in the openings of the mirror layer 5. For the sake of clarity, subregions of the insulation layer 6, which electrically insulate the first through-contacts 81 from the second semiconductor layer 22 and from the optically active layer 23, are not shown in FIG. 4A. In particular, the mirror layer 5 has a number of subregions, each of which is assigned to one of the 100 components to be manufactured. The subregions of the mirror layer 5 are especially laterally spaced from each other, wherein separation trenches are present between the subregions of the mirror layer 5 and define positions of the separation lines AB during the singulation of the semiconductor wafer 10. The separation trenches can be filled with a material of the insulation structure 6.

A common contiguous stabilization layer 30 is applied onto the semiconductor body composite 20, for instance after the formation of the mirror layer 5. With regard to its material and layer thickness, the stabilization layer 30 is formed as a self-supporting structure so that after the growth substrate 90 has been removed, the semiconductor wafer 10 can be mechanically supported mainly by the stabilization layer 30. To ensure that the semiconductor wafer 10 does not roll up, a compensation layer 40 is formed on the semiconductor body composite 20, wherein the stabilization layer 30 and the compensation layer 40 are formed with respect to their materials and configuration such that, regarding the mechanical strains, the stabilization layer 30 and the compensation layer 40 counteract so that in total the semiconductor wafer 10 is essentially free of strain and mechanical deformations. Preferably, the compensation layer 40 directly adjoins the stabilization layer 30. Prior to and/or after the application of the compensation layer 40 onto the semiconductor body composite 20, internal strains of the semiconductor wafer can be measured and, if necessary, adjusted by repeated application or removal of parts of the compensation layer 40.

According to the example of a method shown in FIG. 4A, the stabilization layer 30 is formed prior to formation of the compensation layer 40 on the semiconductor body composite 20. Alternatively, the compensation layer 40 can also be applied onto the semiconductor body composite 20 prior to the application of the stabilization layer 30 if the strain within the stabilization layer 30 is known. In this example, the compensation layer 40 can serve as a modified seed layer onto which the stabilization layer 30 is deposited for instance by electroplating.

A connection layer 7 having first terminal points 71 and second terminal points 72 is formed on the stabilization layer 30 or on the compensation layer 40. The first terminal points 71 and the second terminal points 72 are laterally spaced from each other and assigned to different electrical polarities of the components 100 to be manufactured. In FIG. 4A, the first terminal points 71 electrically connect to the first semiconductor layer 21 via the stabilization layer 30 and the first through-contacts 81. The second terminal points 72 electrically connect to the second semiconductor layer 22 via the second through-contacts 82 of the contact structure 8 and the mirror layer 5. The second through-contacts 82 are formed such that they each extend vertically from the respective second terminal point 72 throughout the compensation layer 40 and the stabilization layer 30 to the mirror layer 5. The insulation structure 6 is formed such that the second through-contacts 82 are electrically isolated from the compensation layer 40 and from the stabilization layer 30. Since the connection layer 7 comprising the terminal points 71 and 72 does not or not significantly contribute to the mechanical stabilization of the semiconductor wafer 10 or of the components 100 to be manufactured, the connection layer 7 having the terminal points 71 and 72 can be formed especially thin. In particular, the terminal points 71 and 72 are formed as flat metallization pads.

In FIG. 4B, the substrate 90 is separated from the semiconductor wafer 10. After removal of the substrate 90, the remaining semiconductor wafer 10 can be singulated into a plurality of components 100 along a plurality of separation lines AB. In this example, the stabilization layer 30 and/or the compensation layer 40 are cut through.

The components 100 arising from the singulation are shown in FIG. 4C and each correspond in particular to the component 100 shown in FIG. 1. The components 100 shown in FIG. 4C thus each have a semiconductor body 2 as part of the semiconductor body composite 20, wherein the semiconductor body 2 is arranged for instance directly on a carrier 1. The entire carrier 1 is produced in particular directly during the singulation of the semiconductor wafer 10. In other words, the carrier 1 is different from such a carrier of a component produced for instance separately from the semiconductor body 2 and mechanically and/or electrically connects to semiconductor body 2 by a connection layer. In particular, prior to singulation of the semiconductor wafer 10, the carrier 1 comprises all integral parts produced on the semiconductor body composite 20. The integral parts of the carrier 1 shown in FIG. 4C comprise one carrier layer 3, one compensating layer 4, one connection layer 7, one mirror layer 5, one contact structure 8 having the through-contacts 81 and 82 and one insulation structure 6. Moreover, the carrier 1 does not contain any other parts that significantly contribute to the mechanical stabilization of the component.

The component 100 shown in FIG. 4C can have side flanks showing singulation traces. The side flanks of component 100 that connect the front side 101 to the rear side 102 of the component 100, may have side surfaces of the semiconductor body 2, the insulation structure 6, the carrier layer 3 and of the compensating layer 4. The semiconductor body 2, the compensating layer 4, the carrier layer 3 and/or the insulation structure can be flush with each other on the side flanks of the component 100.

If a component has a semiconductor body and a metallic carrier formed directly on the semiconductor body, it can be made particularly thin, compact and stable at the same time. If the carrier also has a metallic main carrier layer and a compensating layer, wherein the compensating layer in particular directly adjoins the main carrier layer and counteracts internal mechanical strain in the main carrier layer, issues concerning strains occurring in the component or in a semiconductor wafer can be addressed efficiently.

This application claims priority of DE 10 2016 114 550.5, the subject matter of which is incorporated herein by reference.

Our methods and components are not restricted to the examples by the description made with reference to examples. This disclosure rather comprises any novel feature and any combination of features, including in particular any combination of features in the appended claims, even if the feature or combination is not itself explicitly indicated in the claims or examples.

What is claimed is:

1. A component comprising a carrier and a semiconductor body arranged on the carrier, wherein
    the semiconductor body comprises a semiconductor layer facing away from the carrier, a further semiconductor layer facing the carrier and an optically active layer located therebetween,
    the carrier has a metallic carrier layer that is contiguous and mechanically stabilizes the component,
    the carrier comprises a mirror layer disposed between the semiconductor body and the metallic carrier layer,
    the carrier has a compensating layer directly adjacent to the metallic carrier layer and is configured to compensate for internal mechanical strains in the component, and
    the compensating layer is arranged between the semiconductor body and the metallic carrier layer.

2. The component according to claim 1, wherein the compensating layer is formed as a planar layer and has a substantially constant layer thickness along lateral directions.

3. The component according to claim 1, wherein the metallic carrier layer and the compensating layer each have a substantially constant layer thickness along lateral directions and are free of vertical elevations and/or vertical branches.

4. The component according to claim 1, wherein the carrier layer is formed as a mechanically self-supporting layer so that the component is mechanically supported by the carrier layer and, with the exception of the metallic carrier layer and/or of the compensating layer, the component is free of further carrier layers.

5. The component according to claim 1, formed as an optoelectronic semiconductor chip, wherein the carrier is the only chip carrier and is free of a shaped body made of plastic, silicone, epoxy, ceramic or a semiconductor material.

6. The component according to claim 1, wherein the metallic carrier layer is at least one material selected from the group consisting of Ni, Cu, W, Au, Al, Pt and Ti, and the compensating layer is at least one material selected from the group consisting of TiW, Ti, TiN, SiN, Si, Pt, TiWN, WN, Ni and silicon oxide.

7. The component according to claim 1, wherein the metallic carrier layer has a vertical layer thickness of 1 µm to 80 µm.

8. The component according to claim 1, wherein the metallic carrier layer has a vertical layer thickness of 10 µm to 60 µm.

9. The component according to claim 1, wherein the compensating layer has a vertical thickness of 1 µm to 30 µm.

10. The component according to claim 1, wherein the carrier layer has a vertical height of at least 50% of the total height of the component.

11. The component according to claim 1, wherein the metallic carrier layer electrically conductively connects to the semiconductor body.

12. The component according to claim 1, further comprising a contact structure that electrically contacts the semiconductor layers and is at least partially integrated into the carrier and partially integrated into the semiconductor body.

13. The component according to claim 1, wherein the compensating layer laterally terminates at least substantially flush with the metallic carrier layer.

14. The component according to claim 1, wherein the common compensation layer is formed as a modified seed layer to which the common stabilization layer is electroplated.

15. The component according to claim 14, wherein the modified seed layer has a vertical height of at least 1 µm.

16. The component according to claim 14, wherein the modified seed layer has a vertical height of at least 3 µm.

17. The component according to claim 1, wherein the component is free of a carrier produced separately from the semiconductor body.

18. The component according to claim 1, wherein the mirror layer is electrically conductive and electrically connects to the metallic carrier layer or the compensating layer.

19. The component according to claim 1, wherein the mirror layer is electrically isolated from the metallic carrier layer and the compensating layer.

20. The component according to claim 1, wherein the metallic carrier layer has a vertical height at least 3 times as great as a vertical height of the compensating layer or the mirror layer.

* * * * *